United States Patent [19]

Hu et al.

[11] Patent Number: 5,511,020
[45] Date of Patent: Apr. 23, 1996

[54] PSEUDO-NONVOLATILE MEMORY INCORPORATING DATA REFRESH OPERATION

[75] Inventors: Chenming Hu, Alamo; Fu-Chieh Hsu, Saratogo, both of Calif.

[73] Assignee: Monolithic System Technology, Inc., San Jose, Calif.

[21] Appl. No.: 157,358

[22] Filed: Nov. 23, 1993

[51] Int. Cl.$^6$ ............................................. G11C 13/00
[52] U.S. Cl. .............................. 365/185.28; 365/185.17; 365/222; 365/185.25
[58] Field of Search ........................... 365/174, 182, 365/222, 185, 189.01, 230.01

[56] References Cited

U.S. PATENT DOCUMENTS

| | | | |
|---|---|---|---|
| 5,040,036 | 8/1991 | Hazani | 365/185 |
| 5,140,552 | 8/1992 | Yamauchi et al. | |
| 5,146,431 | 9/1992 | Eby et al. | |
| 5,198,380 | 3/1993 | Harari | |
| 5,278,428 | 1/1994 | Yamada | 365/185 |

OTHER PUBLICATIONS

Aritome et al., "Reliability Issues of Flash Memory Cells," Proceedings of the IEEE, vol. 81, No. 5, May, 1993, pp. 776–787.
Kynett et al., "A 90ns 100K Erase/Program Cycle Megabit Flash Memory," IEEE Int'l Solid–State Circuits Conferences, Feb., 1989, pp. 140–141.
Lancaster, et al., "A 5V–Only EEPROM with Internal Program/Erase Control," *Nonvolatile Semiconductor Memo-ries, Technologies, Design, and Applications,* IEEE Press Selected Reprint Series, Paper 4.7, pp. 149–151 (reprinted from IEE ISSCC Dig. Techn, Pap., 1983, pp. 164–165).
Samachisa, et al., "A 128K Flash EEPROM Using Double-–Polysilicon Technology," *Nonvolatile Semiconductor Memories, Technologies, Design, and Applications,* IEEE Press Selected Reprint Series, Paper 5.3, pp. 176–182 (reprinted from IEEE J. Solid–State Circuits, vol. SC–22, No. 5, Oct., 1987, pp. 676–683).
Yatsuda et al., "Hi–MNOS II Technology for a 64–kbit Byte-Erasable 5–V–Only EEPROM," *Nonvolatile Semiconductor Memories, Technologies, Design, and Applications,* IEEE Press Selected Reprint Series, Paper 4.8, pp. 152–159 (reprinted from IEEE Journal of Solid–State Circuits, vol. SC–20, No. 1, Feb., 1985, pp. 144–151).

*Primary Examiner*—Terrell W. Fears
*Attorney, Agent, or Firm*—Skjerven, Morrill, Macpherson, Franklin & Friel; Norman R. Klivans; E. Eric Hoffman

[57] ABSTRACT

A pseudo nonvolatile memory cell which may be operated in a pseudo-nonvolatile mode is achieved by utilizing a thin direct tunneling dielectric adjacent to the charge retaining region in a traditional nonvolatile memory cell such as an EPROM, EEPROM, flash EPROM, or flash EEPROM cell. The use of the direct tunneling dielectric allows for greatly enhanced write/erase cycles (exceeding 100 gigacycles) and reduced data write/erase time (under 1 microsecond). The direct tunneling dielectric also results in a reduced data retention period. Consequently, refresh circuitry is provided to maintain the non-volatility of the memory cell. A back-up battery is used to power the refresh circuitry when the system power is removed. This mode of operation provides an effectively nonvolatile memory system that is suitable for replacing traditional nonvolatile memory devices.

43 Claims, 13 Drawing Sheets

PSEUDO-NONVOLATILE MEMORY INCORPORATING DATA REFRESH OPERATION

FIELD OF THE INVENTION

The present invention relates to nonvolatile semiconductor memories.

BACKGROUND OF THE INVENTION

There are three major classes of semiconductor memory: static random access memory (SRAM), dynamic random access memory (DRAM) and nonvolatile memory (NVM). Each SRAM cell contains either six transistors or four transistors and two resistors. Consequently, the area of each SRAM cell is large and the cost is high. A DRAM cell requires one transistor and one capacitor, with the capacitor consuming significant cell area and increasing manufacturing cost. Because of its smaller cell area and lower cost, DRAM enjoys a much larger market than SRAM. However, the DRAM cell, like the SRAM cell, has limited data retention.

The data, or electric charge, stored in a DRAM cell usually dissipates a few milli-seconds after the external power is turned off. The electric charge stored in a DRAM cell is also dissipated when a read operation is performed A simple writeback operation, or "refresh" following a read operation extends the validity of the data as long as external power is on.

Junction leakage in a DRAM cell also depletes the charge stored in the cell. Consequently, the refresh operation must be performed periodically, typically every several milliseconds. Because of the short refresh period and the fact that all DRAM cells need to be powered up during a refresh operation, the power needed to keep DRAM refreshed is therefore fairly high. A back-up battery to prevent data loss upon removal of the external power supply must therefore have a high capacity.

Nonvolatile SRAM has been produced with in-package battery back-up to keep the content of the memory valid when external power is removed. This battery must maintain a supply voltage $V_{cc}$ of one to three volts, provide power to the entire SRAM memory array and sustain all leakage and load currents. During the battery back-up mode, there is no active circuit operation.

In contrast, NVM such as EPROM, EEPROM, flash EPROM and flash EEPROM requires only a single transistor per cell. Data is stored in the form of charge inside the transistor gate oxide, with the aid of a floating polysilicon gate or layer of silicon nitride rich in charge traps. Such silicon nitride layers are presently found in metal/silicon-nitride-oxide-silicon (MNOS) or silicon-oxide-nitride-oxide-silicon (SONOS) memories. The small size of NVM cells allows for high density memory systems. Another advantage of NVM cells is that they retain their data storage content even after power supply is removed.

Traditional NVM cell construction and operation is based on the optimization of cell data retention time, programming margin and cell endurance. Data retention time, which is typically 10 years, and programming margin, which needs to be high to ensure long data retention time, are the primary concerns. In order to achieve long data retention time, the Fowler-Nordheim tunneling dielectric in such cells must have very low leakage current under normal read or disturb conditions. That is, the electron transmission coeffiecient of the Fowler-Nordheim tunneling dielectric must be sufficiently large to prevent the transfer of charge during these conditions. The tunneling dielectric therefore needs to be relatively thick. Traditional Fowler-Nordheim tunneling dielectrics used in NVM cells have an effective oxide thickness of 8 to 12 nanometers (nm) and are made of oxide, nitride or oxynitride or oxide/nitride combinations. This thick dielectric provides a significant number of charge traps. Consequently, some programming electrons in transit through the dielectric and holes generated by the high electric field (necessary to perform write/erase operations) are trapped in the dielectric material. As more write/erase operations are performed, progressively more electron trapping occurs, thereby suppressing the tunneling rate of programming electrons and causing the programming margin to deteriorate and the endurance cycle to be limited. Also, progressively more holes are trapped, thereby causing a leakage current which degrades the retention time. Eventually, the charge accumulation causes the dielectric to break down.

One drawback of NVM, compared to SRAM and DRAM, relates to write and erase speed. The write and erase speeds of NVM are about 10 microseconds and 10 milliseconds, respectively. SRAM and DRAM perform write and erase operations in approximately 20–100 nanoseconds. Thus SRAM and DRAM are much faster than traditional NVM.

Another drawback of NVM is reliability. Reliability is measured by the endurance and retention capabilities of the cell. Endurance refers to the failure of the device after repeated write and erase operations, usually due to failure of a dielectric layer through which electrons or holes pass to accomplish these operations. For this reason, EPROMs, EEPROMs, and flash EEPROMs have a limited ability to perform write and erase operations. A typical EPROM, EEPROM or flash EEPROM will suffer endurance based failure after 1,000–100,000 write/erase cycles. The other reliability issue, retention, refers to the gradual loss of data due to charge leakage over a long period of time The usual specification for NVM data retention time years. Thus, NVM has a much higher data retention time than SRAM or DRAM. It is noted that the refresh operation used for DRAM cells, where the charge stored in the cell is discharged, amplified and replenished back directly, cannot be used for NVM cells. This is because the charge stored in the NVM cell does not readily discharge, unlike the charge on the capacitor of a DRAM cell.

To overcome these drawbacks of conventional memory devices, it has been proposed to create a memory cell by coupling an EEPROM device to a DRAM device. (See, Yamauchi et al, U.S. Pat. No. 5,140,552, and Eby et al, U.S. Pat. No. 5,146,431). These memory cells, however, are not area-efficient because both an EEPROM cell and a DRAM cell must be used for each memory cell.

It is therefore desirable to have a pseudo nonvolatile memory (PNVM) cell having a high density, increased write/erase speed, and increased endurance (the best features of both volatile and non-volatile memory). It is also desirable to have a low power refresher circuit which periodically refreshes the data in the PNVM cell so that the PNVM cell may be operated in nonvolatile memory applications.

SUMMARY OF THE INVENTION

In accordance with the present invention, a pseudo-nonvolatile memory (PNVM) transistor is provided having a thin direct tunneling dielectric having a thickness less than a thickness of a traditional Fowler-Nordheim tunneling dielectric. The structure of this PNVM transistor includes: a substrate having a source and a drain; a charge retaining region overlying, but not in contact with, the substrate; a control gate overlying, but not in contact with, the charge retaining region; and a direct tunneling dielectric juxtaposed with the charge retaining region. Charge is transferred through the direct tunneling dielectric to the charge retaining region.

This structure allows the PNVM cell in accordance with the present invention to exhibit write/erase cycles exceeding 100 gigacycles and data write/erase times under 1 microsecond. Such a PNVM cell has a data retention period substantially less than ten years because the direct tunneling dielectric allows greater charge leakage. Therefore, a refresher circuit for periodically refreshing the charge stored in the PNVM cell is provided. The present invention thereby effectively provides a pseudo nonvolatile memory transistor that is suitable for replacing traditional nonvolatile memory devices.

DETAILED DESCRIPTION

Figure 1:
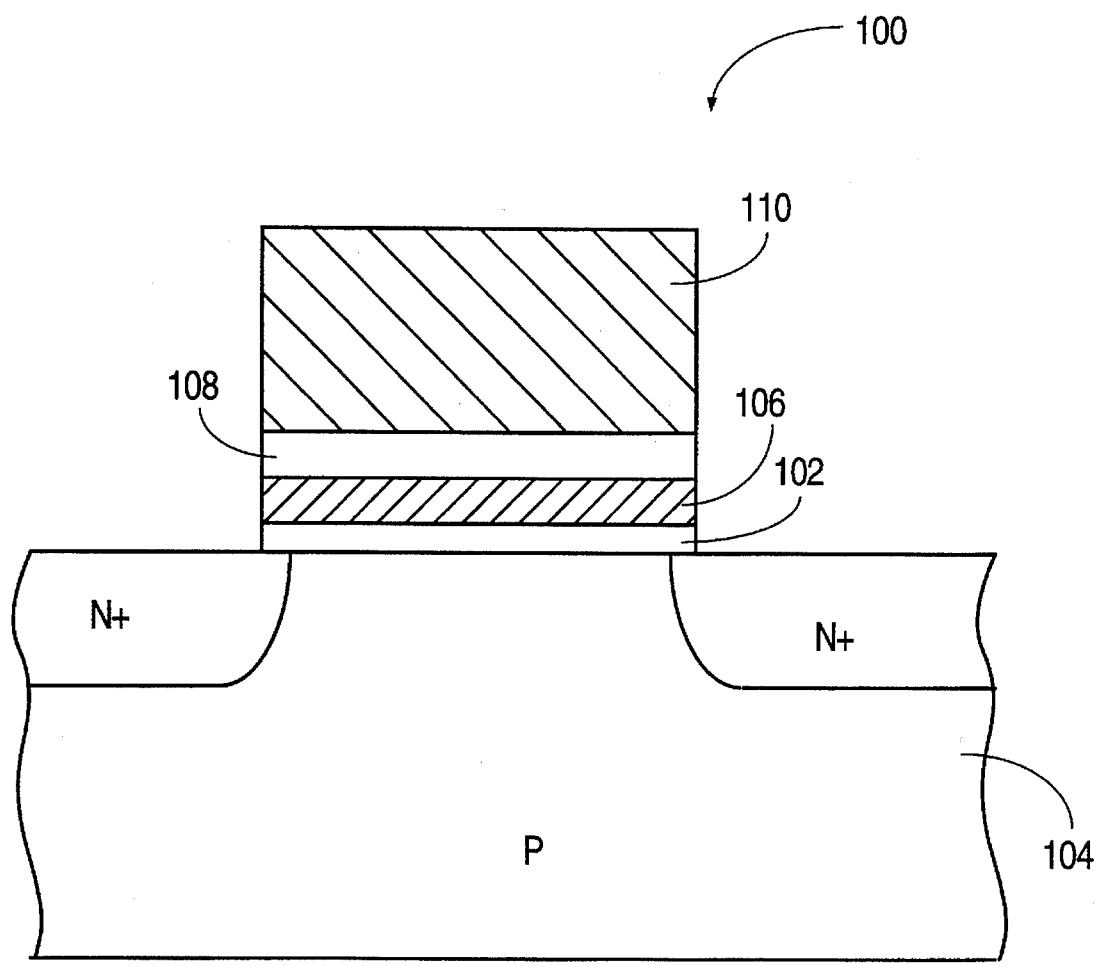
FIG. 1 illustrates a cross section of a PNVM cell in a floating gate configuration.

In the present invention, a pseudo nonvolatile memory (PNVM) device having refresh capabilities is provided. FIG. 1 illustrates a cross section of a PNVM cell 100 in a floating gate configuration. This floating-gate PNVM cell 100 is similar to EPROM, EEPROM, and flash EEPROM cells, however, the direct tunneling dielectric 102 between the substrate 104 and the floating gate 106 is very thin, between 1.5 nm and 5 nm. This dielectric 102 may be oxide, poly-oxide, nitride, oxynitride or a combination thereof. These dielectric materials are typically silicon-based. Poly-oxide refers to an oxide produced by oxidizing a polycrystalline material, such as polysilicon. Typical materials used for floating gate 106 include polysilicon, a metal or a silicide. The dielectric layer 108 between the floating gate 106 and the control gate 110 is also appropriately thin to provide the necessary coupling of voltage from the control gate 110 to the floating gate 106.

Figure 2A:
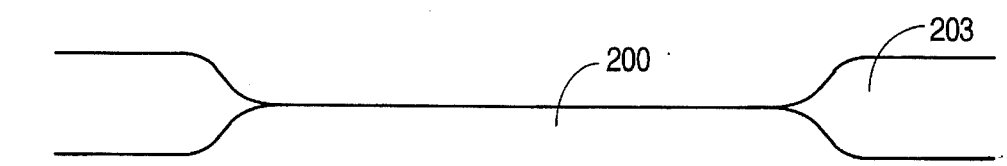
FIGS. 2a through 2f illustrate a set of process steps which may be used to fabricate the PNVM cell of FIG. 1.

A set of process steps to fabricate the PNVM cell of FIG. 1 is illustrated in FIGS. 2a–2f. As shown in FIG. 2a, conventional CMOS fabrication methods are used to form LOCOS isolation layer 203 on the surface of silicon substrate 200. A standard wet chemical clean is performed on the exposed surface of the silicon substrate in preparation for the very thin, high quality oxide growth.

Figure 2B:
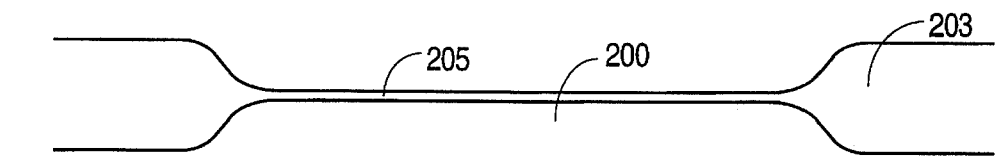

As shown in FIG. 2b, a very thin direct tunnelling oxide layer 205, 1.5 nm to 5 nm in thickness, is then grown. This oxide 205 may be thermally grown at temperatures ranging from 600° C. to 950° C. The thermal growth may be performed in an atmosphere including oxygen, steam, or oxygen or steam diluted with relatively inert gasses such as nitrogen or argon. The direct tunnelling oxide layer 205 can also be deposited by various plasma-enhanced or hot wall chemical vapor deposition (CVD) methods. One such CVD method includes the chemical reaction of silane or dichloro-silane with oxygen. In another CVD method, the oxide 205 is created by reacting silane or dichloro-silane with nitrous oxide ($N_2O$) gas.

Figure 2C:
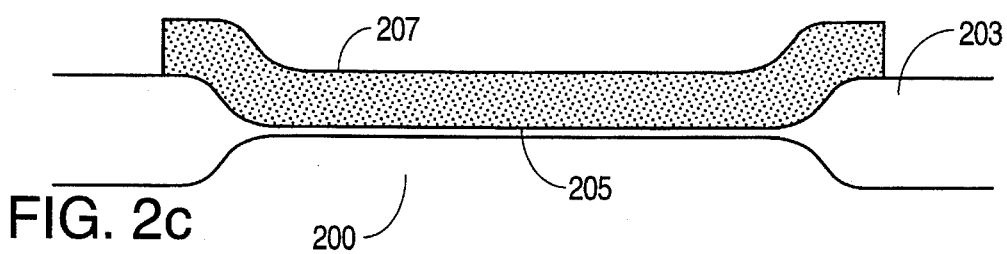

Next, a thin layer of floating gate material 207, in the range of 10 nm to 300 nm, is deposited. The conductive floating gate material 207 may include doped polycrystalline silicon (polysilicon) or amorphous silicon, deposited by means of CVD. High work-function conducting materials such as platinum may be deposited by means of physical vapor deposition (PVD) methods to create the floating gate 207. After the floating gate material 207 is deposited, the floating gate may be patterned using standard lithographic definition techniques followed by standard plasma etching techniques (FIG. 2c).

Figure 2D:
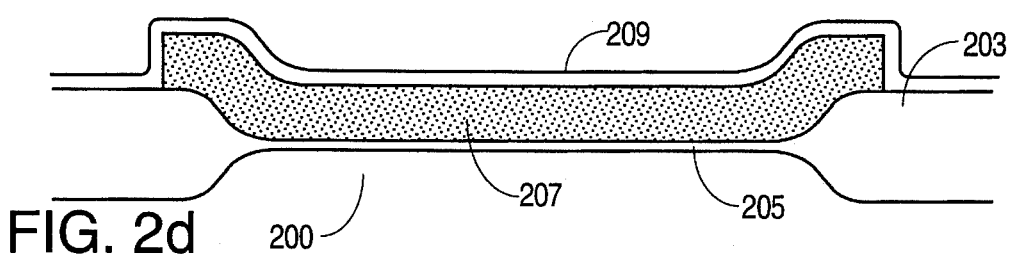

Next, as illustrated in FIG. 2d, a thin insulator layer 209 is formed. The material used for the thin insulator layer 209 may be, e.g., silicon oxide, silicon nitride or tantalum oxide. The silicon oxide is thermally grown or deposited to a thickness of 3 to 40 nm by various CVD methods as previously described in connection with FIG. 2b above. Silicon nitride can be deposited by CVD by chemically reacting ammonia with dichloro-silane. The thin insulator layer 209 can also be a composite of many insulating layers thermally grown or chemically deposited. In one embodiment the insulator layer 209 consists of an oxide/nitride/oxide sandwich.

Figure 2E:
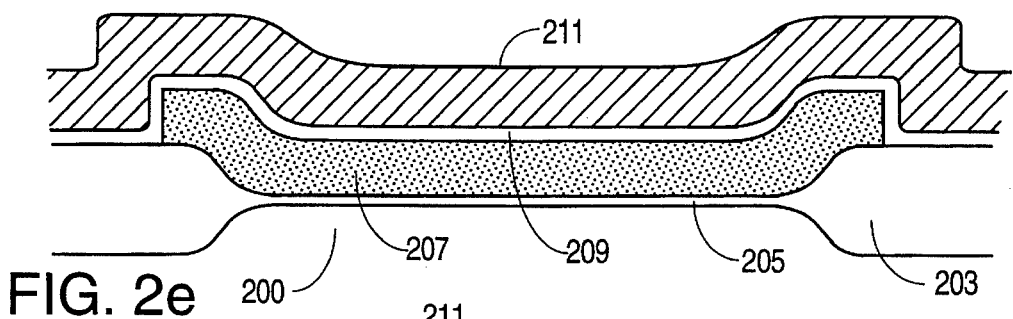

As shown in FIG. 2e, the control gate 211 is then deposited over the thin insulator layer 209. A thin control gate material having a thickness in the range of 50 nm to 300 nm is deposited. Control gate materials include doped polycrystalline or amorphous silicon deposited by means of CVD. A highly conductive silicide layer, for example tungsten silicide or titanium silicide may be deposited on top of the control gate 211 to reduce the resistance of the control gate 211.

Figure 2F:
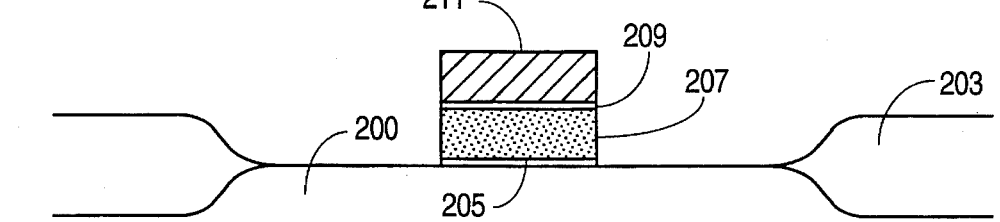

As illustrated in FIG. 2f, unwanted portions of the control gate 211, inter-gate insulator 209 and floating gate 207 are etched away by lithographic definition and plasma-etching techniques commonly used in IC fabrication. The additional steps of the fabrication sequence are similar to most standard CMOS processes where the N-type and P-type transistors are fabricated, followed by metallization steps where memory cells and peripheral transistors are connected through metal lines and vias.

The PNVM cell of FIG. 1 performs read, write and erase operations in the same manner as typical NVM devices, with the following differences.

Because the direct tunneling dielectric 102 is much thinner than a typical Fowler-Nordheim dielectric, this dielectric 102 has a much lower effective resistance per unit area. The resistance per unit area of the direct tunneling dielectric 102 is 1,000 to 1,000,000 times less than the resistance of a typical Fowler-Nordheim dielectric. This lower resistance exists because the thin direct tunneling dielectric 102 presents an electron transmission coefficient much higher than the transmission coefficient associated with traditional Fowler-Nordheim dielectrics. This high electron transmission coefficient results in a relatively high probability that charge will pass through the energy barrier associated with the direct tunneling dielectric 102.

Consequently, the reduced resistance of the direct tunneling dielectric 102 reduces the programming voltage required to pass charge between the substrate 104 and the floating gate 106. Charge is injected from the substrate 104 into the floating gate 106 at a high rate when the voltage across the direct tunneling dielectric 102 approaches the potential barrier of the dielectric/substrate interface, or approximately 3 volts for an oxide/silicon interface.

Figure 3:
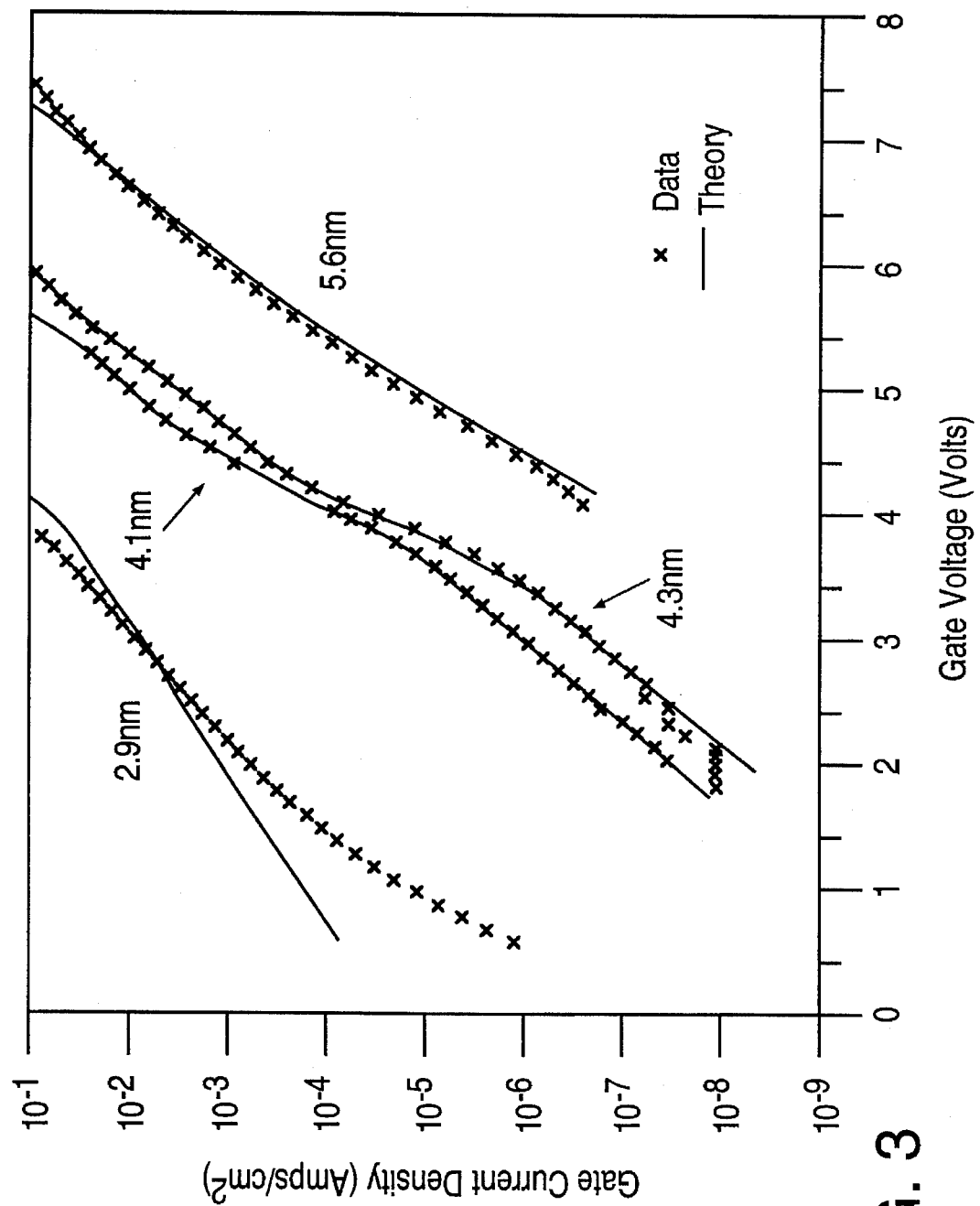
FIG. 3 is a graph illustrating typical dielectric current density as a function of dielectric voltage and dielectric thickness.

Therefore, the programming voltage of the present invention is reduced from the 8–15 volt level associated with a typical NVM cell to approximately 5–10 volts. Because the dielectric resistance is greatly reduced and the programming voltage is only moderately reduced when compared to a typical NVM cell, the programming current associated with a PNVM cell of the present invention is greatly increased relative to the programming current in an NVM cell. This result is illustrated in FIG. 3, which shows the current density (vertical axis) through the tunneling dielectric as a function of programming voltage (horizontal axis) for four dielectric thicknesses ($X_{OX}$), ranging from 2.9 to 5.6 nm. FIG. 3 shows that for a given programming voltage, the current density increases dramatically as the dielectric becomes thinner, both theoretically and experimentally.

The increased programming current reduces the programming time of a PNVM cell, when compared to the programming time of a typical NVM cell. Because the programming current is inversely related to the programming time (Q=I×t), and the charge stored in a PNVM cell in accordance with the present invention is approximately equal to the charge stored in a typical NVM cell, the high programming current associated with the present invention results in a greatly reduced programming time. The typical write and erase times for a PNVM cell in accordance with the present invention are typically less than 1 micro-second and 100 micro-seconds, respectively.

Additionally, the direct tunneling dielectric 102 causes the PNVM cell to exhibit greatly increased cell endurance. There are several reasons for this. First, the direct tunneling dielectric 102 has a smaller volume in which charge trapping can occur when compared with traditional Fowler-Nordheim dielectrics. In addition, the lower programming voltage associated with the direct tunneling dielectric 102 greatly reduces the rate of hole generation. Furthermore, direct tunneling dielectric 102 can not retain the trapped charge efficiently because the trapped charge can tunnel out of the dielectric into the substrate or the control gate. Therefore, a very low charge trapping rate exists within the direct tunneling dielectric 102 compared to thicker dielectrics utilized in the Fowler-Nordheim regime. This low trapping rate allows a greater amount of charge to be passed through the direct tunneling dielectric 102 before dielectric breakdown occurs.

Figure 4:
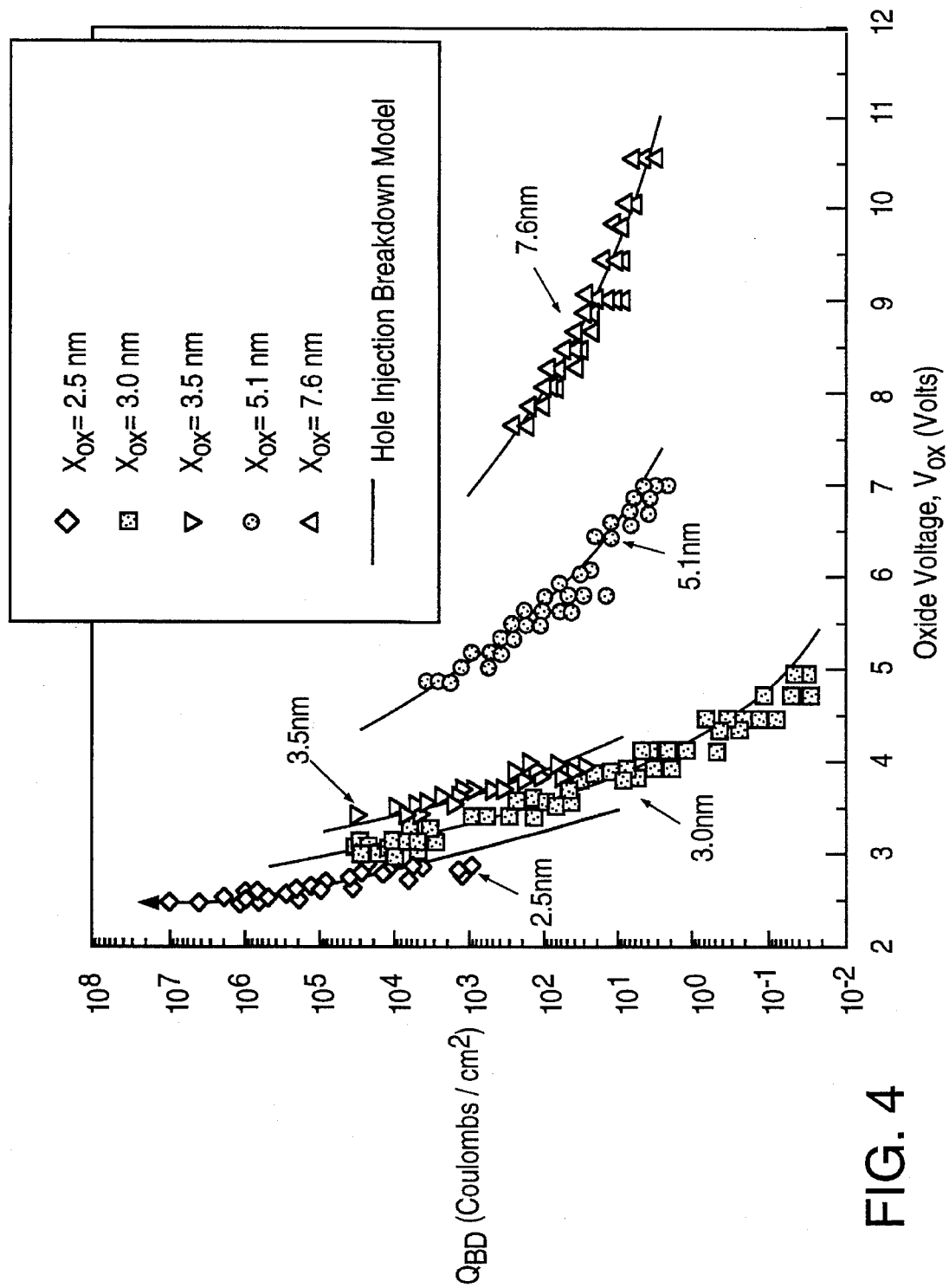
FIG. 4 is a graph illustrating the total charge which may be passed through a dielectric before dielectric breakdown occurs ($Q_{BD}$) as a function of dielectric voltage and dielectric thickness.

One measure of cell endurance is the total charge per unit area which may be passed through the dielectric before breakdown occurs. This parameter is designated $Q_{BD}$. The endurance cycling capability of an NVM may be estimated by dividing $Q_{BD}$ by $10^{-5}$ coulombs/cm$^{-2}$, the approximate charge passing through the tunneling dielectric during each program/erase cycle. FIG. 4 illustrates $Q_{BD}$ (vertical axis) as a function of dielectric voltage (horizontal axis) and various dielectric thicknesses. FIG. 4 indicates that a PNVM cell in accordance with the present invention, having a direct tunneling dielectric with a thickness of 2.5 nm and a programming voltage of 2.5 volts will have an endurance cycling capability of more than 100 gigacycles.

In general, a large increase in current density results in a small reduction in PNVM cell endurance as measured by $Q_{BD}$. However, as previously discussed, the thin direct tunneling dielectric significantly increases the endurance of the PNVM cell. The net result remains a large increase in cell endurance. In addition, the slight reduction in endurance caused by the high programming current is justified by the large decrease in programming time associated with this high current.

Figure 5A:
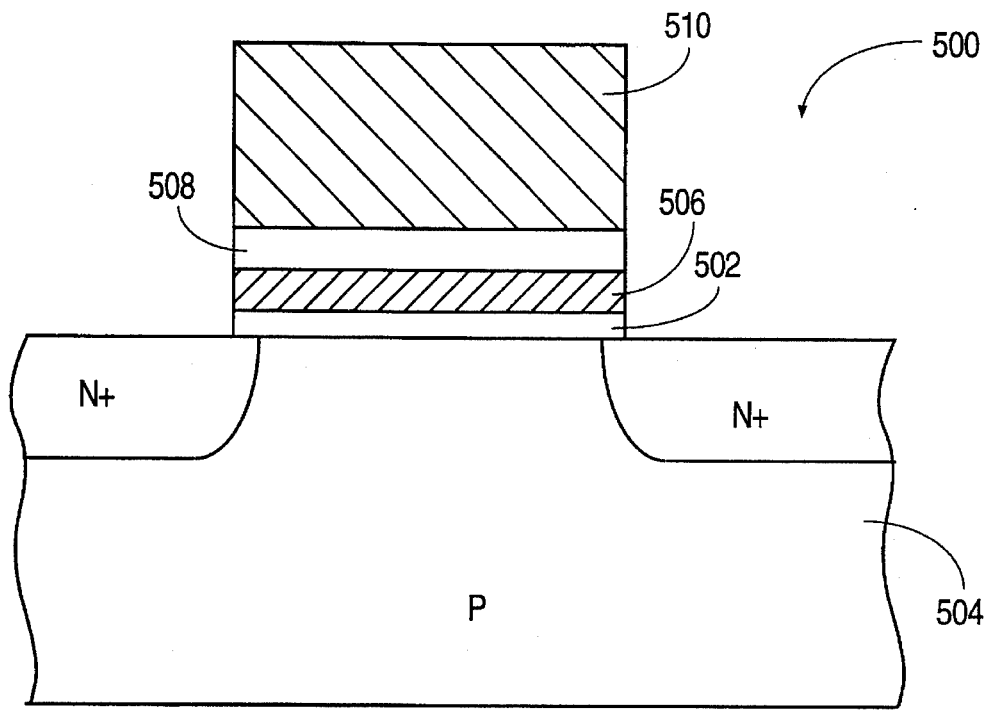
FIGS. 5a and 5b illustrate a cross sections of alternate embodiments of the PNVM cell of the present invention.
Figure 5B:
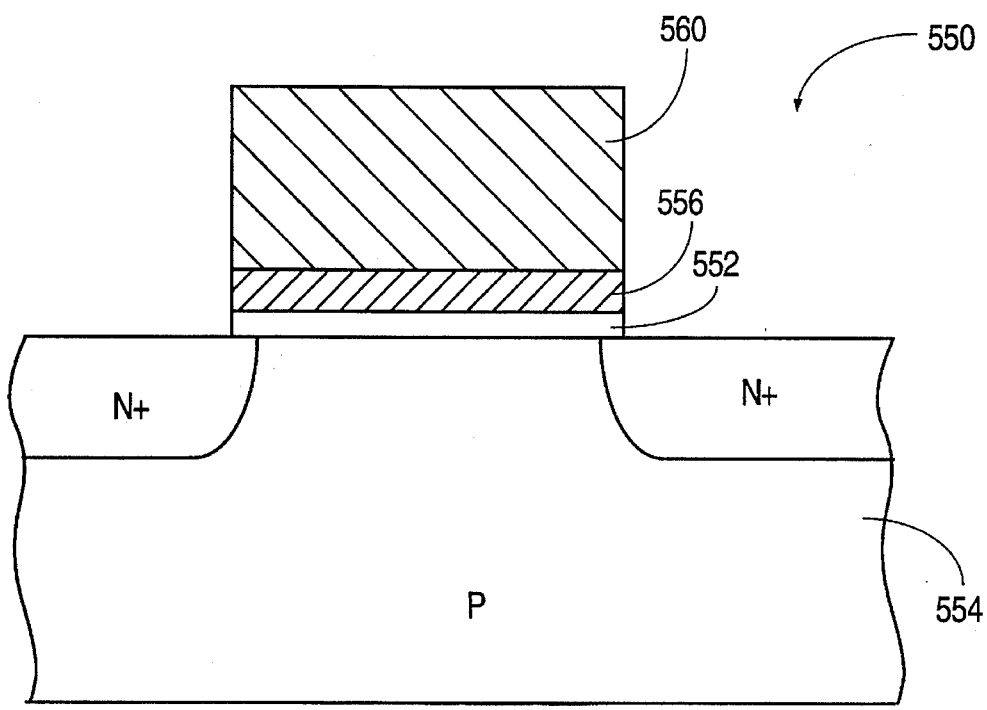

FIGS. 5a and 5b show cross sectional views of alternate, MNOS embodiments of the present invention. As shown in FIG. 5a, PNVM cell 500 includes control gate 510, dielectric 508, direct tunneling dielectric 502 and substrate 504. Data is stored as charge in a thin silicon nitride film 506. Thus, the charge retaining means is a dielectric, rather than a conductor. As illustrated in FIG. 5b, PNVM cell 550 includes control gate 560, direct tunneling dielectric 552 and substrate 554. The dielectric properties of silicon nitride film 556 allow the control gate 560 to directly contact the silicon nitride film 556 in one embodiment of the present invention. The thickness of the direct tunneling dielectric in both FIGS. 5a and 5b is between 0.5 nm and 2 nm. In spite of the acronym, MNOS, it is understood that dielectric materials other than silicon dioxide and charge storage media other than silicon nitride may be used.

Figure 6A:
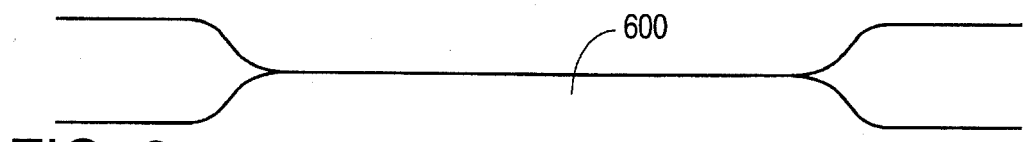
FIGS. 6a through 6f illustrate a set of process steps which may be used to fabricate the PNVM cell of FIG. 5.
Figure 6B:
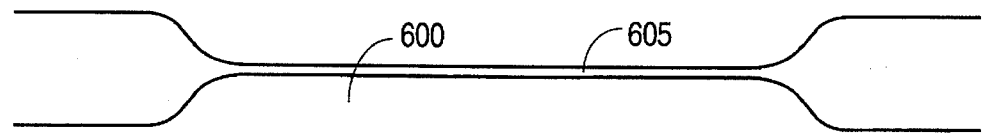
Figure 6C:
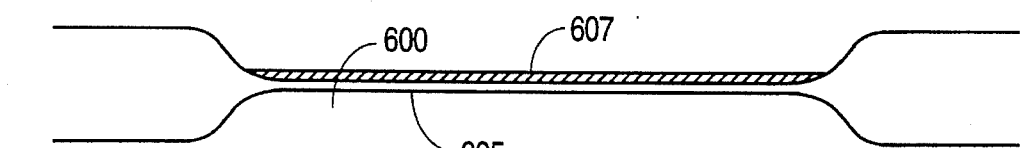

A set of processing steps which may be used to fabricate the PNVM cell of FIG. 5 is illustrated in FIGS. 6a–6f. The steps illustrated in FIGS. 6a and 6b relate to the growth of the direct tunnelling oxide 605 on substrate 600. These steps have been previously described in connection with FIGS. 2a and 2b. As shown in FIG. 6c, a thin layer of silicon nitride 607, having a thickness in the range of 3 nm to 20 nm is deposited by means of CVD by chemically reacting ammonia and silane or dichloro-silane.

Figure 6D:
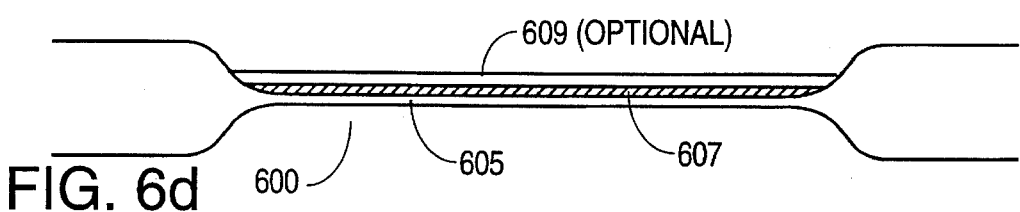

As shown in FIG. 6d, an optional thin oxide layer 609, 0.5 nm to 5 nm in thickness, is formed. This thin oxide layer can be thermally grown by oxidizing the nitride film in a steam atmosphere at 750° to 950° C. This oxide layer can also be deposited by various CVD methods as described in connection with FIG. 2b. An anneal in hydrogen or ammonia at 600° to 900° C. may be performed to enhance the charge storage capability of the nitride film.

Figure 6E:
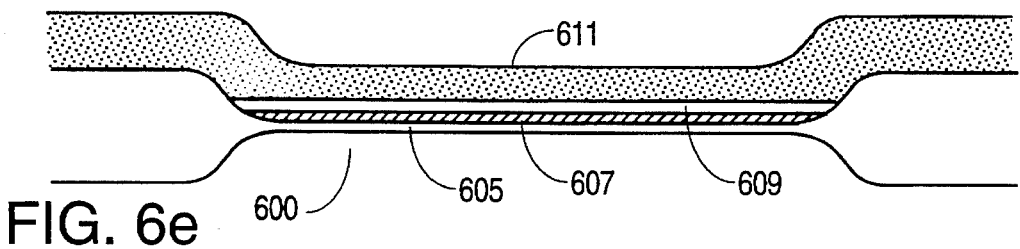
Figure 6F:
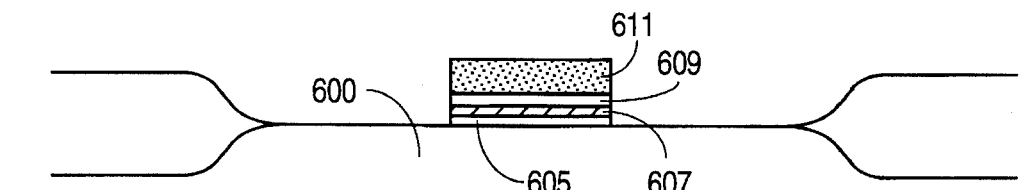

The remaining steps shown in FIGS. 6e and 6f, namely the depositing the control gate 611 and performing an etch, parallel the process steps illustrated and described in connection with FIGS. 2e and 2f.

The PNVM cell of the present invention is not limited to the specific structures illustrated in FIGS. 1, 5a and 5b. Several variations of the basic structures are shown in FIGS.

7a to 7d. The elements of PNVM cells 700a–d include charge retaining regions 706a–d, control gates 708a–d, dielectrics 710a–d, direct tunneling dielectrics 712a–d, and substrates 714a–d. The charge retaining regions 706a–d may include any of the previously described charge retaining media.

Figure 7A:
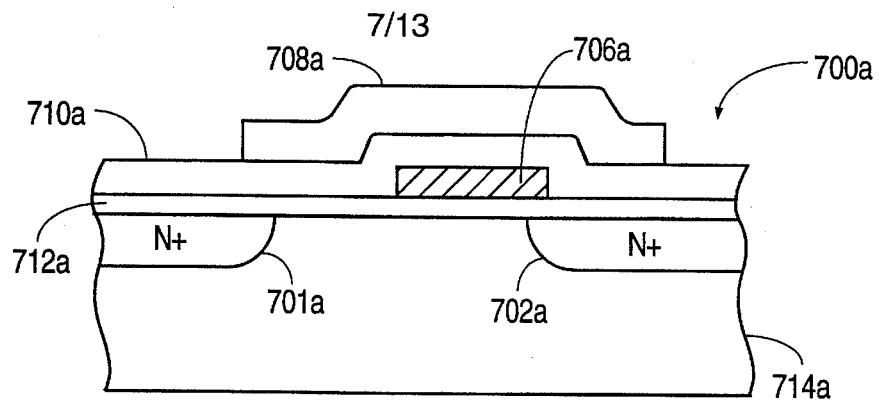
FIGS. 7a through 7d illustrates cross sections of various PNVM cell structures.
Figure 7B:
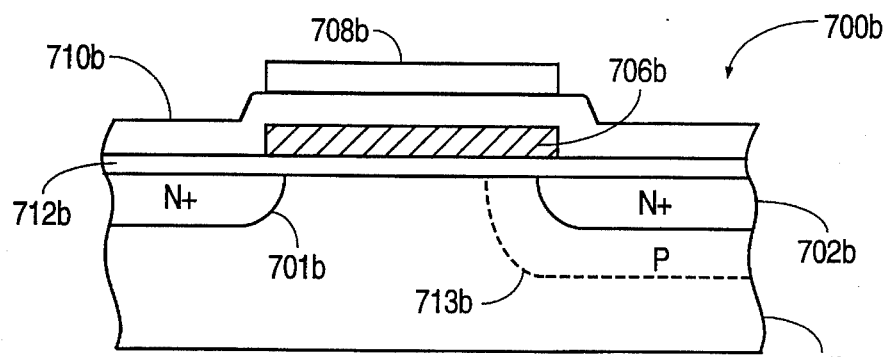
Figure 7C:
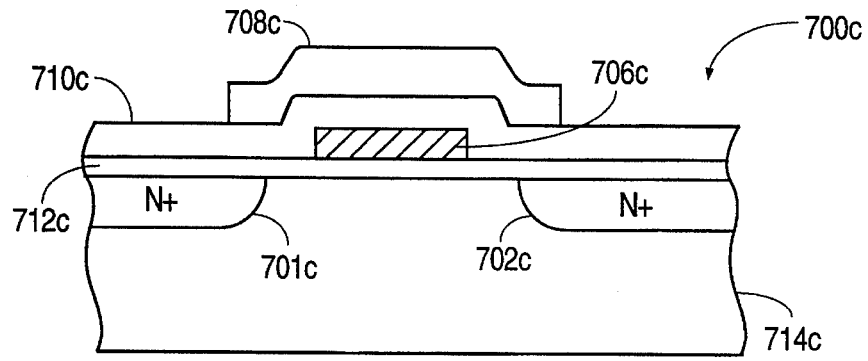

As illustrated in FIG. 7a, the charge retaining region 706a may overlap (overlie) the source 702a and not the drain 701a. The charge retaining region may also overlap the drain but not the source (not illustrated). As shown in FIG. 7b, the charge retaining region 706b may overlap both the source 702b and the drain 701b. An extra mask step is used to allow ion implantation of phosphorous into the source region 702b of the cell, before or after the N+ ion implantation into the drain and source regions. As shown in FIG. 7c, the charge retaining region 706c may overlap neither the source 702c nor the drain 701c.

Figure 7D:
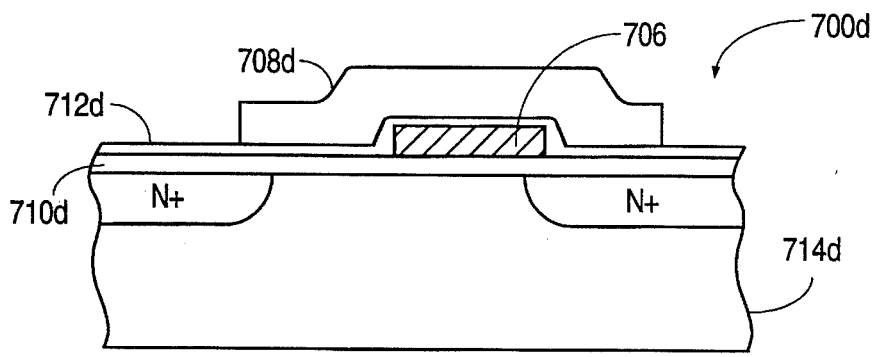

The direct tunneling dielectric may be located below (with reference to the principal surface of the substrate 14a–d) the charge retaining region, or above the charge retaining region, or both. FIG. 7d shows the tunneling dielectric 712d located above the charge retaining region 706d. The tunneling dielectric may be grown on a polysilicon charge retaining region 706d, especially at an edge of the polysilicon. The thin oxide at this edge facilitates the tunnelling of electrons between the floating gate 706d and the control gate 708d. The thin direct tunnelling dielectric 712d is 0.5 to 5 nm of silicon oxide grown in dry or wet oxygen ambient at 750° to 900° C.

The above described structures are illustrative and not intended to limit the scope of the present invention. Other structures previously utilized in connection with NVM cells may also be employed. (See, for example, Chenming Hu, "Nonvolatile Semiconductor Memories Technologies, Design, and Applications" IEEE Press; Seiichi Aritome, et al, "Reliability Issues of Flash Memory Cells" and references therein, Proceedings of the IEEE, Vol. 81, No. 5, May 1993, pp. 776–787; Harari, U.S. Pat. No. 5,198,380).

The leakage current of a PNVM cell of the present invention is relatively high because the thin direct tunneling dielectric is less capable of preventing charge leakage from the charge retaining region than the thicker Fowler-Nordheim dielectrics present in NVM cells. The leakage current of the present invention may be reduced by using a high work-function conductor such as platinum as the floating gate material. However, the data stored in a PNVM cell will still be lost after a number of normal read operations or at some time (much less than ten years) after the external power is removed. Thus, the PNVM cell does not meet the 10 year data retention requirement of traditional NVM cells and therefore may not be used in traditional nonvolatile memories unless a circuit for refreshing the PNVM cells is included.

Figure 8:
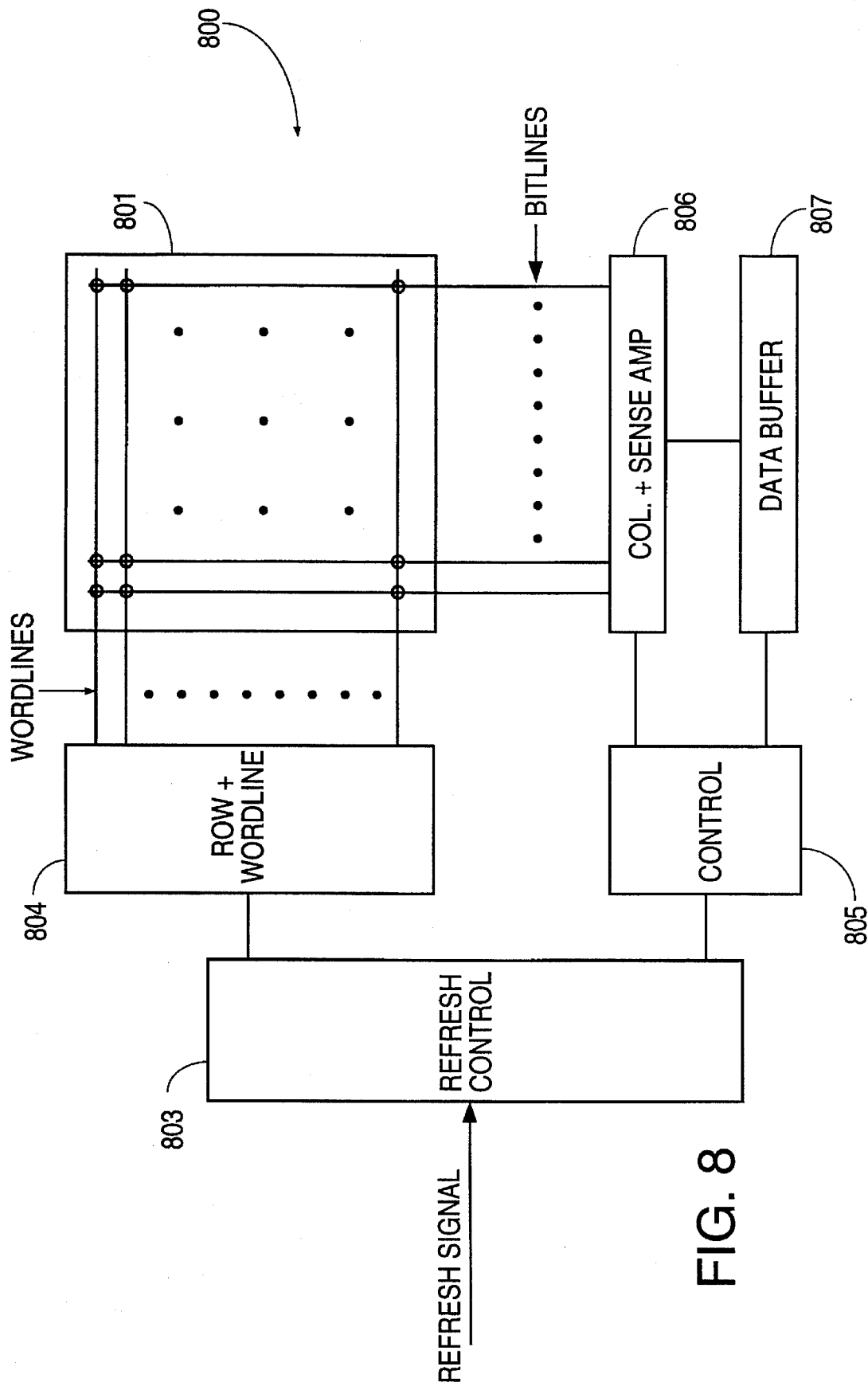
FIG. 8 is a block diagram of one embodiment of a PNVM memory bank and its associated circuit blocks.

Accordingly, a circuit is provided to periodically refresh the data values stored in a PNVM cell. FIG. 8 shows a block diagram of a memory bank 800. This memory bank includes PNVM array 801, refresh control block 803, row and wordline control block 804, control block 805, column and sense amplifier block 806 and data buffer 807. The refresh control block 803 may be located on or off the memory chip which contains the PNVM array 801. A periodic refresh signal enables refresh control block 803 to initiate the refresh operation. This refresh signal may be generated on chip or externally by a refresh timer circuit. The memory cells of array 801 to be written or erased may be selected by the hot-electron writing method normally associated with EPROM, by utilizing the select transistors used by EEPROM or by utilizing an entire wordline as in MNOS. (See, Chenming Hu, p. 152). The select transistors may be integrated into the cell using a method known in the art. (See, for example, Chenming Hu, p. 152, p. 176). The PNVM memory cell array 801 may be refreshed one row of cells or one cell at a time. To refresh a row of cells, the wordline control block 804 provides a read voltage (approximately 3–5 volts) to the first row of PNVM cells. This causes the value of each PNVM cell in the first row to be read out to the sense amplifier block 806. The sense amplifier block 806 stores these values in data buffer 807.

The data buffer 807 is included because the read operation of a PNVM cell is faster than a write/erase operation. Buffer 807 allows the results of a series of read operations to be stored while the write/erase operations are performed. This partially hides the write/erase operations from external or internal accessing devices. The buffer may either be located within the memory device or external to the memory device.

The data buffer 807 and sense amplifier block 806 also act to amplify and invert the signals received from the bitlines. These amplified and inverted signals are transmitted back to the bitlines of the PNVM array. At the same time, the control block 805 causes the wordline block 804 to provide a high "erase" voltage (approximately 5 to 10 volts) to the first row. This refreshes the cells containing a "0" data value.

While the bitline signals are still being provided to the bitlines of the PNVM array, the control block 805 causes the wordline block 804 to switch the wordline voltage of the first row to a low "write" voltage (approximately −5 to −10 volts). This refreshes the cells containing a "1" data value. This procedure is repeated for all of the rows in the PNVM array 801.

Each refresh signal may cause a cell, a byte (8 cells), a sector (a portion of the array), a row or the entire array to be refreshed. However, the entire array 801 is refreshed at a preselected frequency, such as once every few milli-seconds or once every few weeks. The refresh frequency for each cell in the entire array must be greater than the inverse of the data retention period of the PNVM cells in the array.

Figure 9A:
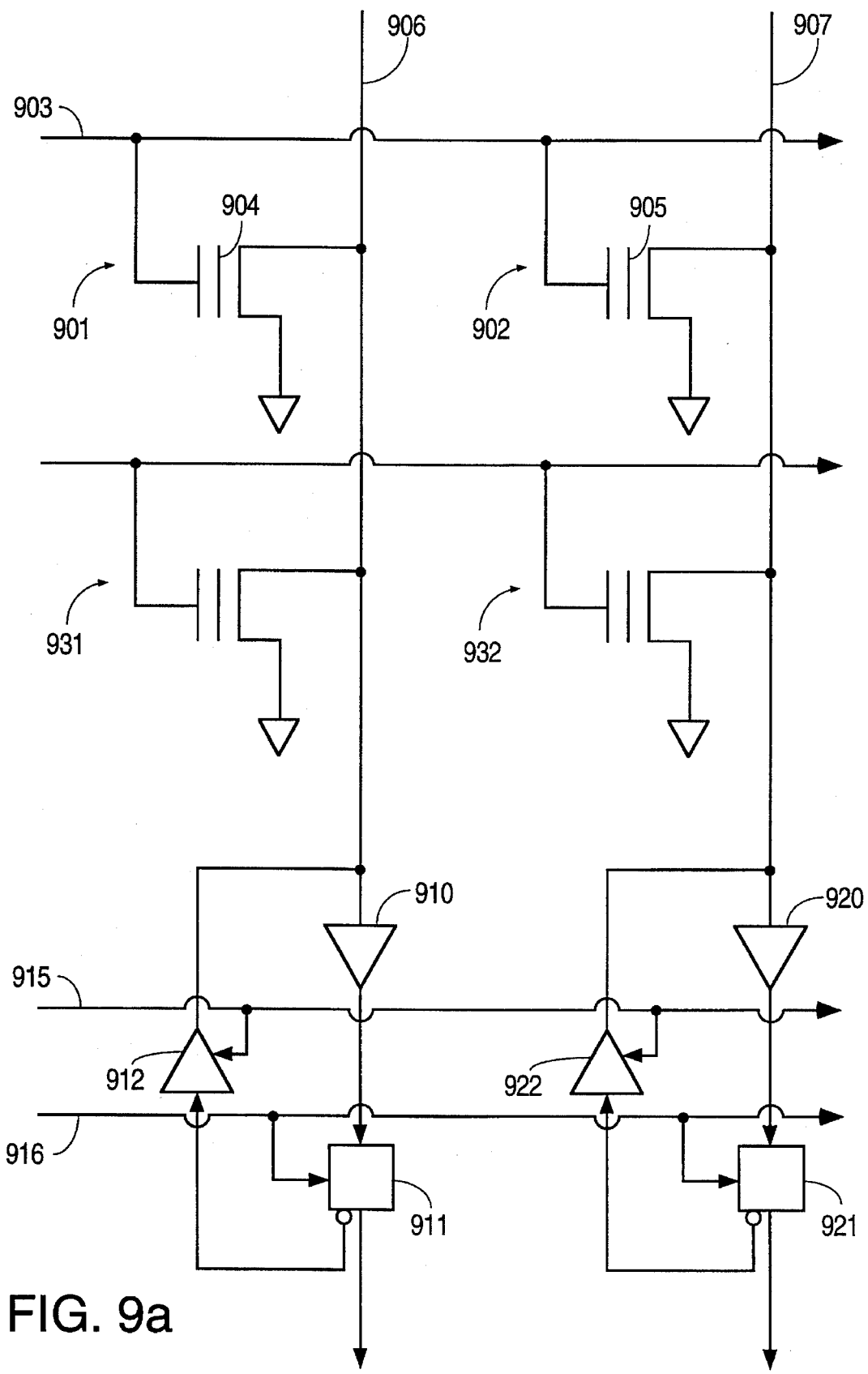
FIGS. 9a and 9b show one embodiment of circuitry associated with selected circuit blocks of FIG. 8.
Figure 9B:
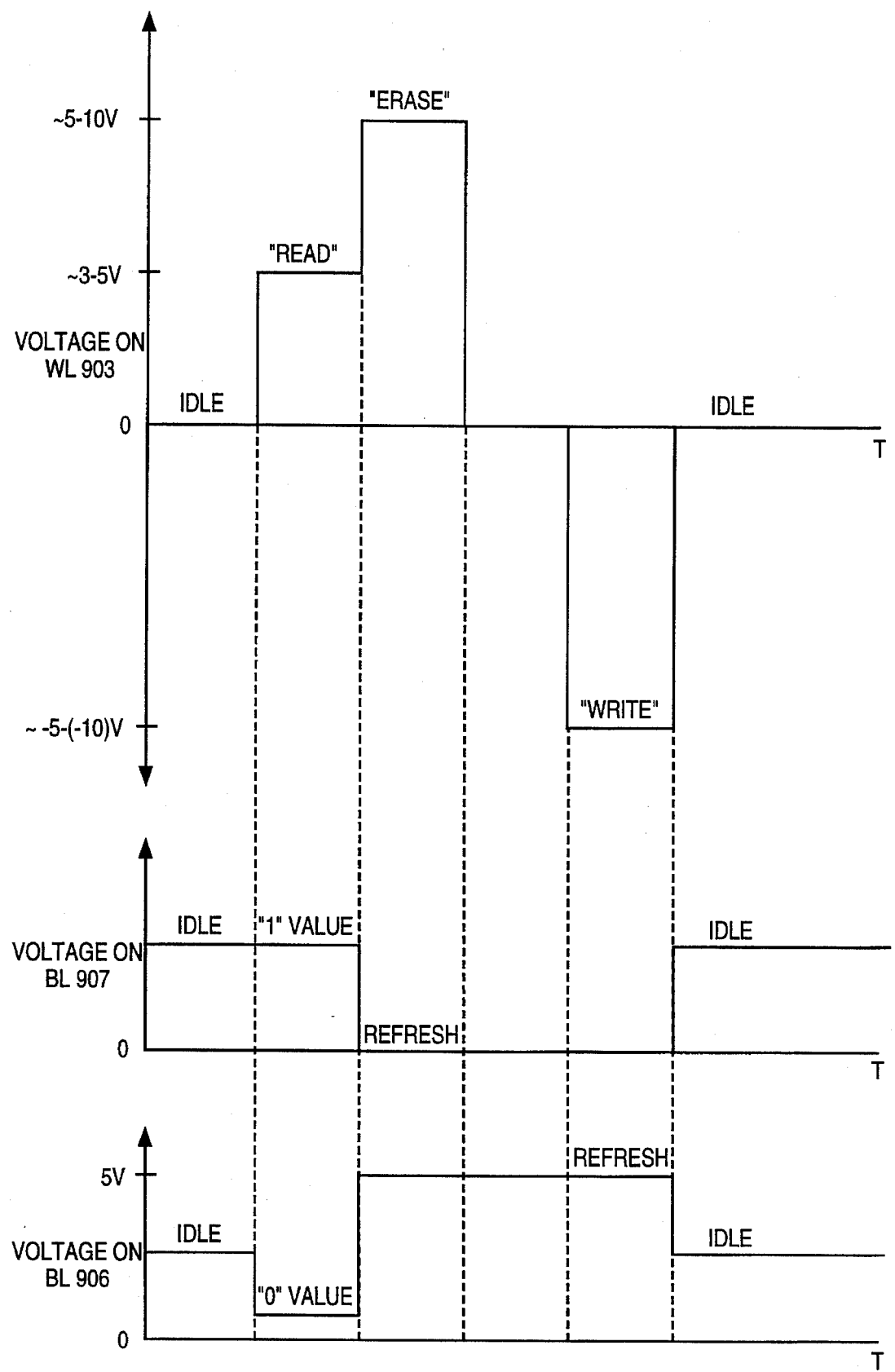

FIGS. 9a and 9b show one embodiment of the circuitry associated with selected circuit blocks of FIG. 8. The charge stored in the PNVM cells 901 and 902 may be read out by applying a read voltage (approximately 3–5 volts) to wordline 903. A charge (a "1" value) stored in the charge storage region 904 of PNVM cell 901 will be read out onto bitline 906 as "0" value. A lack of charge (a "0" value) in the charge storage region 905 of PNVM cell 902 is read out onto bitline 907 as a "1" value.

The "0" value read out onto bitline 906 is provided to sense amplifier 910, where it is amplified. The output of sense amplifier 910 is inverted by latch 911. Latch 911 acts as a buffer and also provides a non-inverted output to a decoder and input/output circuit. The inverted output of latch 911 is provided to high voltage buffer 912. As a result, the high voltage buffer 912 provides a high voltage to bitline 906. The latch 911 and high voltage buffer 912 are controlled by signals transmitted on high voltage buffer control line 915 and latch control line 916. These signals sequentially enable latch 911 and high voltage buffer 912 such that the output on bitline 906 is routed from sense amplifier 910 to latch 911 to high voltage control buffer 912 to bitline 906.

Similarly, the "1" value from PNVM cell 902 is read out onto bitline 907 and routed through sense amplifier 920, latch 921 and high voltage buffer 922. As a result, the high voltage buffer 922 provides a low voltage to bitline 907.

The voltage on wordline 903 is brought to a high "erase" voltage level (approximately 5 to 10 volts). This "erase" voltage, along with the low voltage on bitline 907, results in the PNVM cell 902 being refreshed with a "0" value. The "erase" voltage does not change the "1" value in PNVM cell 901.

With a high voltage on bitline 906 and a low voltage on bitline 907, the voltage on wordline 903 is brought to a low "write" voltage level (approximately −5 to −10 volts). This "write" voltage, along with the high voltage on bitline 906, results in the PNVM cell 901 being refreshed with a "1" value. The "write" voltage does not change the "0" value in PNVM cell 902.

Figure 10:
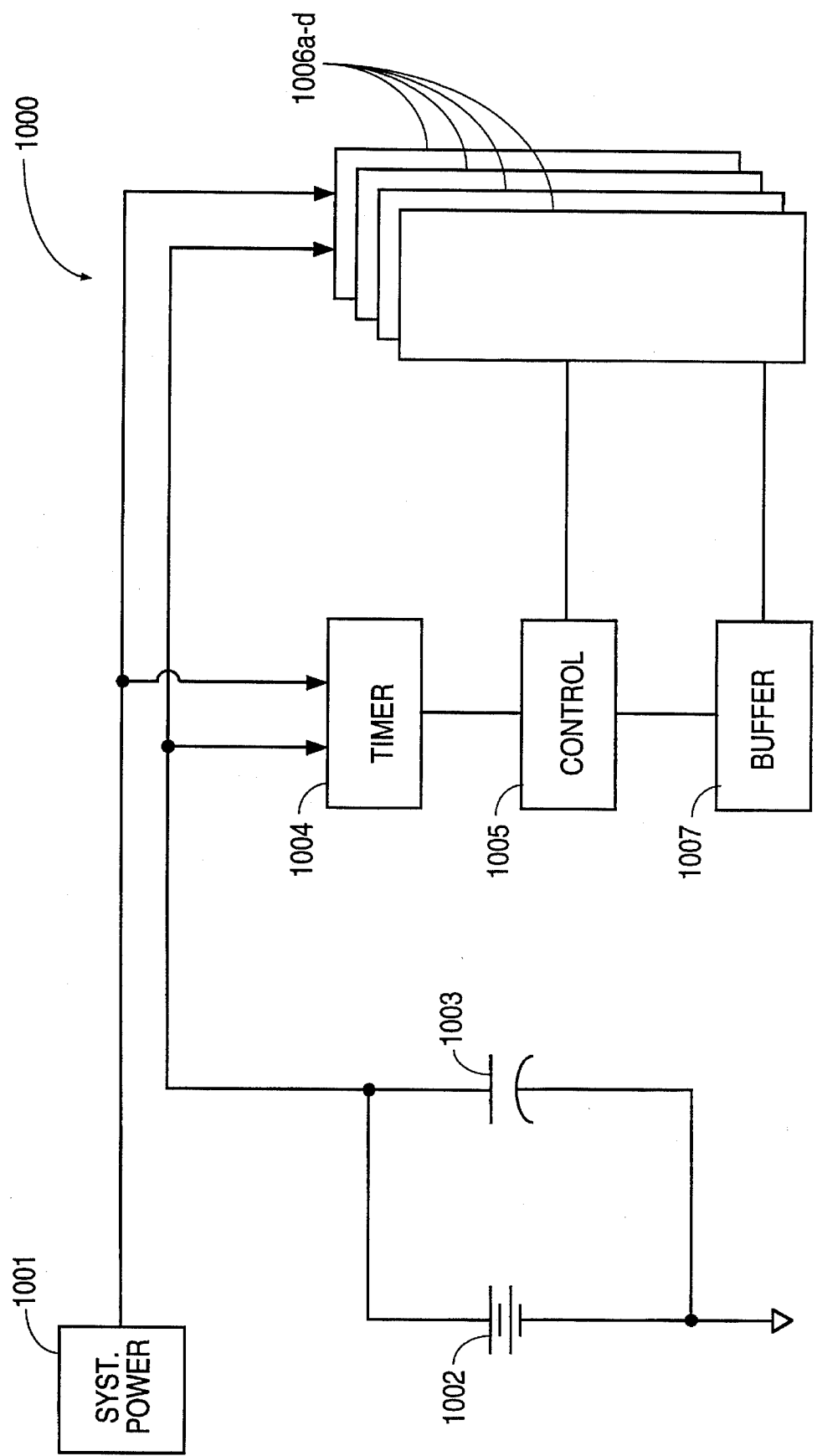
FIG. 10 is a block diagram of an embodiment of a PNVM system with a battery back-up.

Because the PNVM cell of the present invention retains its data for a longer period than a typical DRAM cell, the duty-cycle for the refresh operations required for a PNVM cell is lower than the duty-cycle required for a DRAM cell. Consequently, a very low average current is required to sustain the non-volatility of a memory device made of these PNVM cells. For example, a typical PNVM memory array may have a one hour refresh interval that requires 100 mA of current for 10 milliseconds to perform a refresh operation. This PNVM array consumes an average current of less than 0.03 uA. As a result of this low average current requirement, a back-up battery is capable of performing the refresh operations when the system power is off. FIG. 10 illustrates a block diagram of a refresh circuit which utilizes a back-up battery. When the system power 1001 is off, circuit 1000 is usually in a "sleep" mode in which battery 1002 provides power to capacitor 1003 and timer 1004. At preset intervals, the timer 1004 instructs the controller 1005 to provide a refresh signal to initiate a refresh operation of PNVM memory banks 1006a–d. As discussed later, external data buffer 1007 buffers data from the PNVM memory banks 1006a–d to allow for a faster refresh operation. After the refresh operation has been performed, the circuit 1000 re-enters the "sleep" mode until the next refresh operation is to be performed.

Alternately, the refresh frequency may be determined by monitoring the amount of charge left on a reference cell. The reference cell is refreshed at the same time that the other PNVM cells are refreshed. The charge of the reference cell is monitored by statically tracking its threshold voltage or its read current at fixed gate and drain voltages. In another embodiment, the reference cell is periodically monitored by dynamically reading the reference cell in a manner similar to a conventional NVM write verify operation or a conventional $V_{cc}$ margin test.

If the back-up battery has a voltage level lower than the normal supply voltage of the PNVM memory device, a charge pump, or its equivalent, is used to generate the higher voltages required for the PNVM write/erase operations.

Figure 11A:
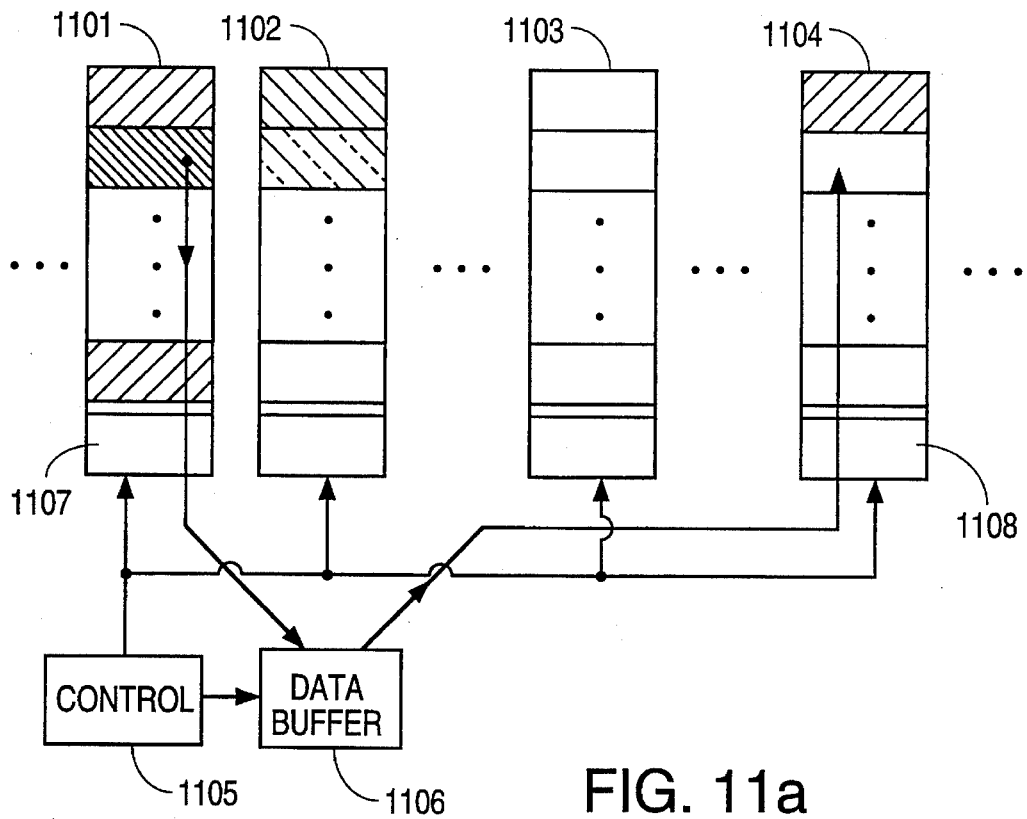
FIGS. 11a and 11b are block diagrams illustrating a refresh operation involving multiple memory banks.

FIG. 11 is a block diagram illustrating a refresh operation involving multiple PNVM memory banks 1101–1104 in a PNVM memory device. Each memory bank consists of at least the elements set forth in FIG. 8, wherein each PNVM array has an address field. For example, memory banks 1101 and 1104 contain address fields 1107 and 1108, respectively. The address in the address field identifies the memory bank. As illustrated in FIG. 11a, memory banks 1103 and 1104 are pre-erased. Control block 1105 provides the appropriate refresh signal to the refresh control block within memory bank 1101 such that the contents of these cells are transferred to data buffer 1106. The contents of the data buffer 1106 are then written to memory bank 1104 using the information stored in data buffer 1106. The contents of the memory bank 1101 (with the exception of the contents of address field 1107) are then erased by control block 1105. Memory bank 1101 is then available to host the contents of another memory bank. The address in the address field 1107 of memory bank 1101 is transferred to the address field 1108 of memory bank 1104. Thus, the address fields of the memory banks must either be programmable, or alternatively, mappable through an address translation means.

Figure 11B:
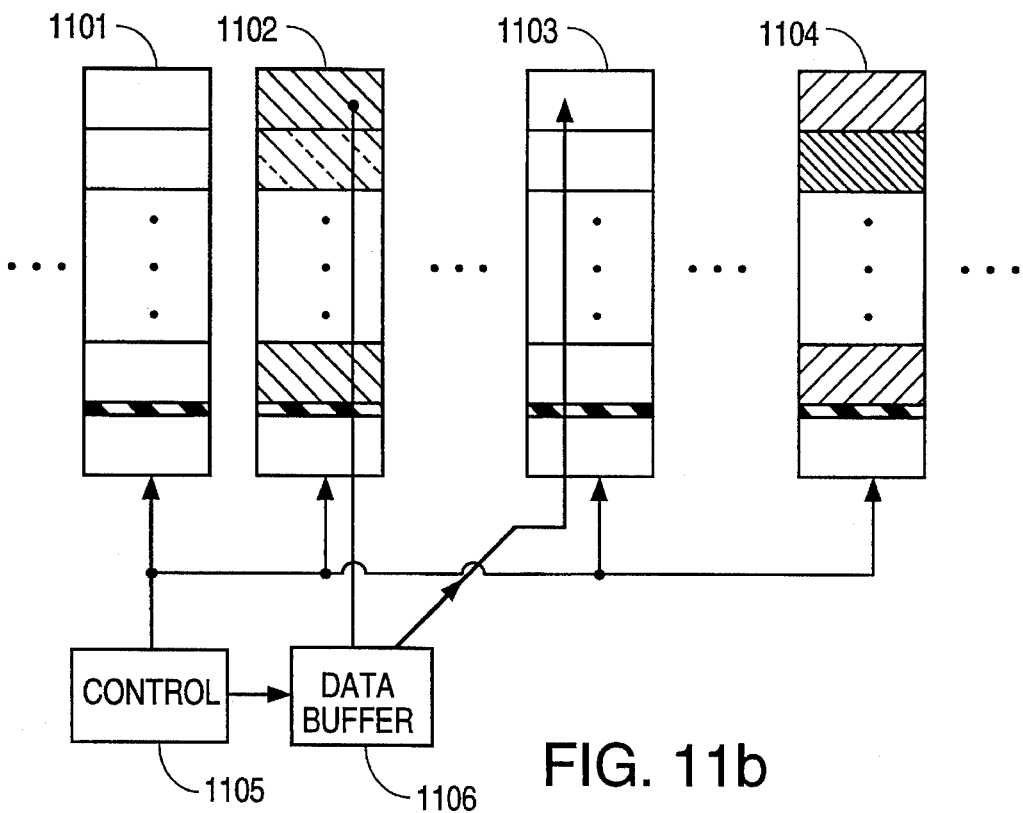

By repeating these steps, an entire PNVM memory device can be refreshed by consecutively moving the contents of memory banks to new locations and providing new address assignments within the same memory device. Thus, data is not repeatedly refreshed at the same memory location. This feature is advantageous in that small portions of large memories are not repeatedly used and hence worn out while the remainder of the memory is unused. Only one "free" memory bank (i.e. memory bank 1104 in the previous example) is required at any given time. However, the availability of more than one "free" memory bank can further speed up the refresh operation. For example, as illustrated in FIG. 11b, the contents of memory bank 1102 may be read to the data buffer 1106 during the time that memory bank 1101 is being erased.

Figure 12:
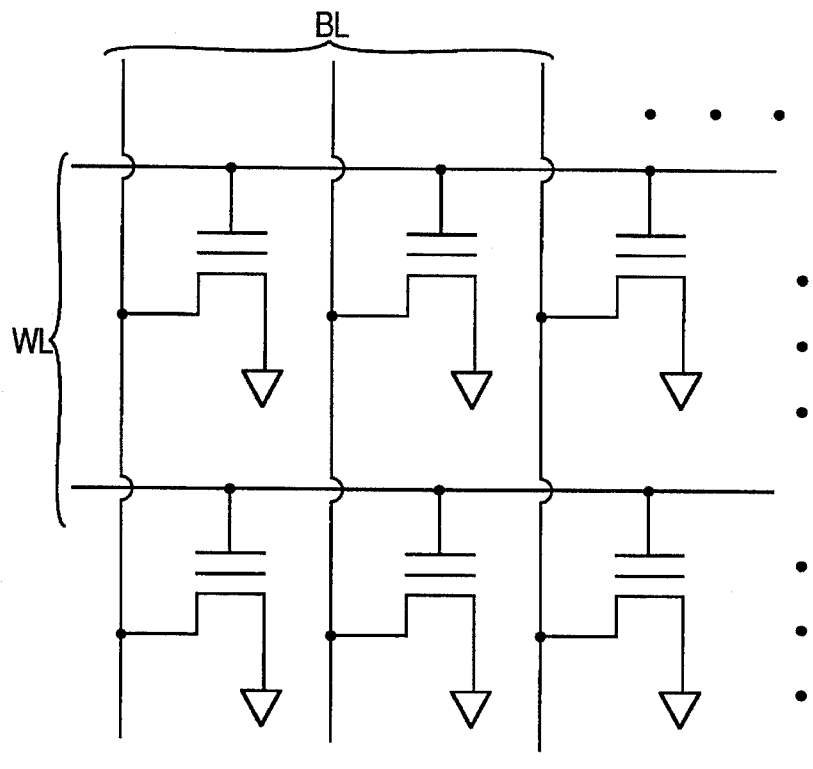
FIG. 12 illustrates PNVM cells of the present invention connected in a NOR configuration.
Figure 13:
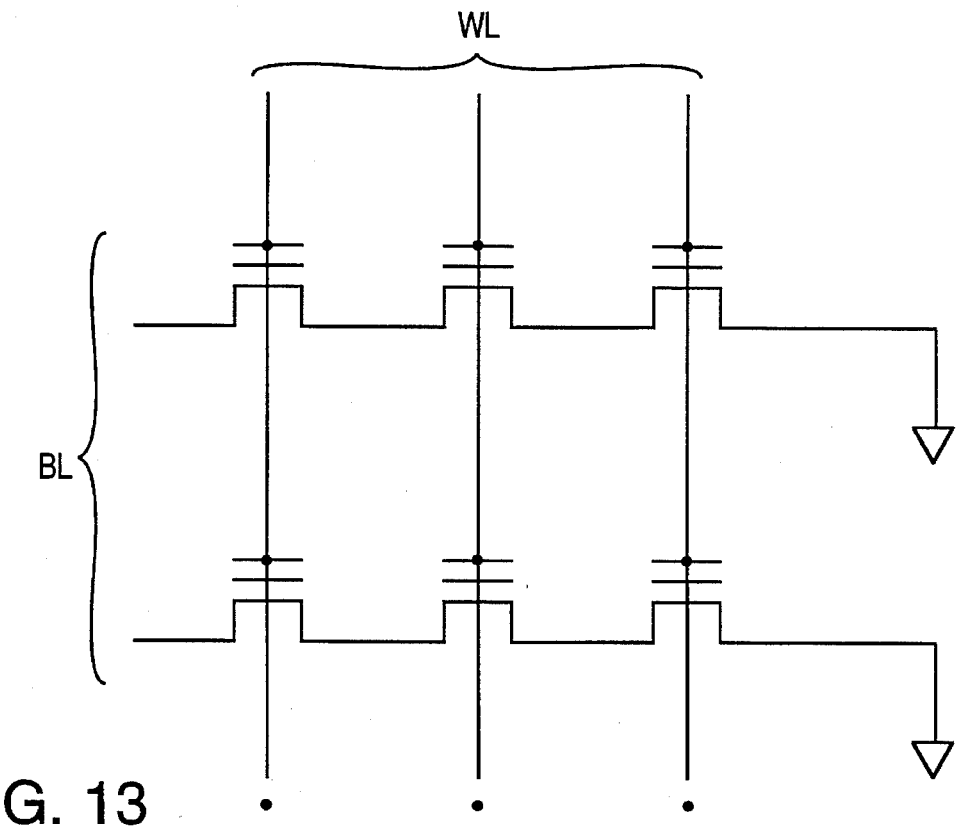
FIG. 13 illustrates PNVM cells of the present invention connected in a NAND configuration.

The PNVM cells may be arranged in memory arrays in either NOR or NAND configuration or a combination thereof. The NOR and NAND configurations are illustrated in FIGS. 12 and 13, respectively. The NOR configuration provides for faster memory array operation, while the NAND configuration provides a smaller memory array size.

While the invention has been described with reference to particular embodiments, this description is solely for the purpose of illustration and is not to be construed as limiting the scope of the invention. Various modifications and applications may be made by those skilled in the art without departing from the scope of the invention as defined in the following claims.

What is claimed is:

1. A pseudo-nonvolatile memory (PNVM) system comprising:

a transistor comprising a substrate having a source region and a drain region spaced apart from the source region, a charge retaining region overlying the substrate and spaced apart therefrom, a control gate overlying the charge retaining region and spaced apart therefrom, a direct tunneling dielectric having a thickness less than a thickness of a Fowler-Nordheim tunneling dielectric, the direct tunneling dielectric juxtaposed with the charge retaining region, whereby transfer of charge occurs through the direct tunneling dielectric to the charge retaining region; and a refresher circuit coupled to the transistor, wherein the refresher circuit periodically refreshes the charge stored in the charge retaining region.

2. The PNVM system of claim 1, further comprising a programming circuit connected to the transistor, said programming circuit having means for applying a write voltage across said control gate and said substrate to store a charge in said charge retaining region and means for applying an erase voltage across said control gate and said substrate to remove a charge from said charge retaining region.

3. The PNVM system of claim 2, wherein the programming circuit limits the voltage applied across said direct tunneling dielectric to less than 5 volts.

4. The PNVM system of claim 2, wherein the application of the write voltage causes the charge to be stored in said charge retaining region in less than 1 micro-second.

5. The PNVM system of claim 2, wherein the application of the erase voltage causes the charge to be removed from said charge retaining region in less than 100 micro-seconds.

6. The PNVM system of claim 1, wherein said refresher circuit comprises an input terminal connectable to receive a refresh request signal used to initiate operation of the refresher circuit.

7. The PNVM system of claim 6, wherein said transistor is located on a chip, and said refresh request signal is generated on said chip.

8. The PNVM system of claim 6, wherein said transistor is located on a chip, and said refresh request signal is generated off of said chip.

9. The PNVM system of claim 6, wherein said refresher circuit comprises,
   a bitline coupled to said substrate;
   a read voltage supply coupled to said control gate, wherein said read voltage supply selectively applies a read voltage to said control gate, wherein a signal representative of the charge on said charge retaining region is read out onto said bitline when said read voltage is applied to said control gate;
   an inverter circuit coupled to said bitline, wherein said inverter circuit amplifies and inverts said signal to create a programming signal which is returned to said transistor on said bitline; and
   a programming voltage supply coupled to said control gate, wherein said programming voltage supply selectively applies a programming voltage to said control gate during the time that said programming signal is returned to said transistor, whereby said charge stored in said charge retaining region is refreshed.

10. The PNVM system of claim 9, wherein said bitline is connected to said source of said transistor.

11. The PNVM system of claim 9, wherein said bitline is connected to said drain of said transistor.

12. The PNVM system of claim 6, wherein said refresher circuit comprises,
    a first bitline coupled to said substrate;
    a read voltage supply coupled to said control gate, said read voltage supply selectively applying a read voltage to said control gate, wherein a signal representative of the charge on said charge retaining region is read out onto said first bitline when said read voltage is applied to said control gate;
    an inverter circuit coupled to said first bitline, wherein said inverter circuit amplifies and inverts said signal to create a programming signal;
    a second bitline coupled to said inverter circuit, said second bitline receiving said programming signal;
    a pre-erased transistor having a substrate coupled to said second bitline, wherein said signal is applied to said substrate of said pre-erased transistor; and
    a programming voltage supply coupled to a control gate of said pre-erased transistor, said programming voltage supply selectively applying a programming voltage to the control gate of said pre-erased transistor, wherein said programming voltage is applied to said control gate of said pre-erased transistor during the time that said programming signal is applied to said substrate of said pre-erased transistor, whereby said charge is refreshed in said pre-erased transistor.

13. The PNVM system of claim 12, wherein said refresher circuit further comprises,
    an addressing circuit which assigns an address corresponding to said transistor to said pre-erased transistor after the charge is refreshed in said pre-erased transistor.

14. The PNVM system of claim 12, wherein said refresher circuit further comprises,
    a circuit which erases the charge in said charge retaining region of said transistor after the charge is refreshed in said pre-erased transistor; and
    means for assigning an unused address to said transistor.

15. The PNVM system of claim 1, wherein said refresher circuit comprises a back-up battery and a controller circuit.

16. The PNVM system of claim 15, wherein said back-up battery is rechargeable.

17. The PNVM system of claim 15 wherein said controller circuit is coupled to said back-up battery and said controller circuit generates a refresh request signal to initiate the refreshing of the charge stored in the charge retaining region.

18. The PNVM system of claim 15, wherein said controller circuit comprises a timer which causes the controller circuit to generate refresh request signals at a preselected frequency, wherein each of said refresh request signals initiates the refreshing of the charge stored in the charge retaining region.

19. The PNVM system of claim 15, wherein said controller circuit comprises:
    a reference transistor;
    means for monitoring a charge on said reference transistor; and
    means for generating a refresh request signal when said charge on said reference transistor drops below a preselected level, wherein said refresh request signal initiates the refreshing of the charge stored in the charge retaining region.

20. The PNVM system of claim 15, wherein said controller circuit comprises a power switch that connects the transistor to the back-up battery.

21. The PNVM system of claim 20, wherein said power switch connects the transistor to the back-up battery only if said transistor is not coupled to an external power supply.

22. The PNVM system of claim 15, wherein said controller circuit comprises a charge pump coupled to said back-up battery, said charge pump boosting the magnitude of the voltage of said back-up battery to create a programming voltage, wherein said programming voltage is used to refresh the charge on said transistor.

23. The PNVM system of claim 22, wherein said charge pump is located on a chip containing said transistor.

24. The PNVM system of claim 22, wherein said charge pump is located off a chip containing said transistor.

25. The PNVM system of claim 22, wherein said charge pump is disabled when an external power supply is coupled to said transistor.

26. The PNVM system of claim 1, wherein the thickness of said direct tunneling dielectric is between 0.5 nanometers and 5 nanometers.

27. The PNVM system of claim 26, wherein said direct tunneling dielectric comprises an oxide, a poly-oxide, a nitride or an oxy-nitride.

28. The PNVM system of claim 1, wherein said charge retaining region comprises an insulating dielectric.

29. The PNVM system of claim 28, wherein said insulating dielectric comprises a nitride.

30. The PNVM system of claim 1, wherein said charge retaining region comprises an interface between insulating dielectrics.

31. The transistor of claim 1, wherein said charge retaining region comprises a floating gate.

32. The transistor of claim 31, wherein said floating gate comprises a metal.

33. The transistor of claim 32, wherein said metal comprises platinum.

34. The PNVM system of claim 1, wherein said direct tunneling dielectric is positioned between said substrate and said charge retaining region.

35. The PNVM system of claim 1, wherein said direct tunneling dielectric is positioned between said control gate and said charge retaining region.

36. The PNVM system of claim 1, wherein said direct tunneling dielectric is positioned at an edge of said charge retaining region.

37. The PNVM system of claim 1, wherein the charge is retained by said charge retaining region for a data retention period substantially less than ten years.

38. The PNVM system of claim 1, wherein the charge is retained by said charge retaining region for a data retention period less than 1 month.

39. The PNVM system of claim 1 wherein said charge retaining region overlies said source and said drain.

40. The PNVM system of claim 1, wherein said charge retaining region overlies said drain but not said source.

41. The PNVM system of claim 1, wherein said charge retaining region overlies said source but not said drain.

42. The PNVM system of claim 1, wherein said charge retaining region does not overlap either said source or said drain.

43. The PNVM system of claim 1, wherein the thickness of said direct tunneling dielectric is less than 8 nanometers.

* * * * *